(12) United States Patent
Fish et al.

(10) Patent No.: US 9,530,682 B2
(45) Date of Patent: Dec. 27, 2016

(54) SYSTEM AND APPARATUS FOR HOLDING A SUBSTRATE OVER WIDE TEMPERATURE RANGE

(71) Applicant: Varian Semiconductor Equipment Associates, Inc., Gloucester, MA (US)

(72) Inventors: Roger B. Fish, Bedford, MA (US); W. Davis Lee, Newburyport, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 472 days.

(21) Appl. No.: 14/275,779

(22) Filed: May 12, 2014

(65) Prior Publication Data

US 2015/0325464 A1    Nov. 12, 2015

(51) Int. Cl.
    *H01L 21/683*      (2006.01)
    *H01T 23/00*       (2006.01)
    *H01L 21/687*      (2006.01)
    *H01L 21/67*       (2006.01)

(52) U.S. Cl.
    CPC ... *H01L 21/68742* (2013.01); *H01L 21/67103* (2013.01); *H01L 21/6831* (2013.01); *H01L 21/6833* (2013.01)

(58) Field of Classification Search
    CPC .. H01L 21/6833; H01L 21/6831; H02N 13/00
    USPC ......................................................... 361/234
    See application file for complete search history.

(56) References Cited

U.S. PATENT DOCUMENTS

| | | | |
|---|---|---|---|
| 6,700,099 B2 | 3/2004 | Cole, Sr. et al. | |
| 7,655,933 B2 | 2/2010 | England et al. | |
| 8,709,528 B2* | 4/2014 | Cheng | H01L 21/68785 118/712 |
| 2004/0196613 A1* | 10/2004 | Zheng | H01L 21/68735 361/234 |
| 2010/0039747 A1* | 2/2010 | Sansoni | H01L 21/6833 361/234 |
| 2010/0142113 A1* | 6/2010 | Lee | H01L 21/6833 361/234 |

* cited by examiner

*Primary Examiner* — Dharti Patel (57) ABSTRACT

An apparatus to support a substrate may include a base, a clamp portion to apply a clamping voltage to the substrate, and a displacement assembly configured to hold the clamp portion and base together in a first operating position, and to move the clamp portion with respect to the base from the first operating position to a second operating position, wherein the clamp portion and base are separate from one another in the second operating position.

20 Claims, 9 Drawing Sheets

SYSTEM AND APPARATUS FOR HOLDING A SUBSTRATE OVER WIDE TEMPERATURE RANGE

FIELD

The present embodiments relate to substrate processing, and more particularly, to electrostatic clamps for holding substrates.

BACKGROUND

Substrate holders such as electrostatic clamps are used widely for many manufacturing processes including semiconductor manufacturing, solar cell manufacturing, and processing of other components. Many substrates such as semiconductor device wafers may be subject to processing over a wide range of substrate temperatures even for the same type of process. For example during manufacturing of a logic or memory device it may be desirable to perform a first implant into a given wafer in which ion implantation is conducted while the substrate is maintained at room temperature or at a lower temperature. It may further be desirable to conduct a second implant into the same wafer at an elevated temperature such as at 400° C. or above. In order to accommodate both implantation processes in the same implantation apparatus without undue complexity and expense of time, it may be desirable that a single electrostatic clamp function both at room temperature and at elevated temperatures. However present day electrostatic clamps may not be suitable for operation over a wide substrate temperature range, such as between −100° C. and 500° C. This is in part due to thermal properties of components of an electrostatic clamp as well as the substrate, in which differences in coefficient of thermal expansion among components of the electrostatic clamp as well as a substrate may generate large internal stresses when substrates are subjected to processing that involve temperature changes over a large range. This problem is exacerbated as the size of substrates scales up to larger dimensions, which additionally may entail the use of larger area electrostatic clamps. Accordingly, it is common practice to employ a dedicated electrostatic clamp for operation at high substrate temperature, and a dedicated electrostatic clamp to operate at room temperature or below.

It is with respect to these and other considerations that the present improvements have been needed.

SUMMARY

This Summary is provided to introduce a selection of concepts in a simplified form that are further described below in the Detailed Description. This Summary is not intended to identify key features or essential features of the claimed subject matter, nor is it intended as an aid in determining the scope of the claimed subject matter.

In one embodiment, an apparatus to support a substrate may include a base, a clamp portion to apply a clamping voltage to the substrate, and a displacement assembly configured to hold the clamp portion and base together in a first operating position, and to move the clamp portion with respect to the base from the first operating position to a second operating position, wherein the clamp portion and base are separate from one another in the second operating position.

In another embodiment, an electrostatic clamp system may include a base, a clamp portion comprising a plurality of electrodes configured to apply a clamping voltage to a substrate, a heat control layer disposed between the base and clamp portion, and a displacement assembly coupled to the clamp portion. The displacement assembly may be configured to hold the base and clamp portion together in a first operating position, and configured to move the clamp portion with respect to the base from a first operating position to a second operating position, wherein in the second operating position the base, clamp portion, and heat control layer are mutually separated from one another so as to define a first gap between the base and heat control layer and a second gap between the clamp portion and heat control layer.

In a further embodiment, a method to hold a substrate holding a base and a clamp portion together in a first operating position when the clamp portion is unheated, moving the base and clamp portion from the first operating position using a displacement component that is affixed to the clamp portion in a first region of the displacement component and affixed to the base in a second region of the displacement component; and heating the clamp portion when the base and clamp portion are in the second operating position, wherein a first thermal conduction between the base and the clamp portion that results from the first operating position is greater than a second thermal conduction between the base and clamp portion that results from the second operating position.

DETAILED DESCRIPTION

The embodiments described herein provide apparatus and systems for holding substrates over a wide temperature range. In various embodiments electrostatic clamps and electrostatic clamp systems are provided that facilitate operation of a given electrostatic clamp both at room temperature and below room temperature, as well as at elevated temperature, such as at 400° C. or above. Various embodiments provide an expandable electrostatic clamp having a base that is separable from a clamping part, and includes a displacement assembly and displacement system that is configured to displace the base and clamping part with respect to one another. The clamping part may be a ceramic component that includes conventional electrodes for generating an electrostatic voltage to apply a clamping force to a substrate. As detailed below, the displacement system may adjust the relative position or displacement of the base and ceramic from a first operating position that is suitable for high temperature operation to a second operating position that is suitable for room temperature operation.

Figure 1A:
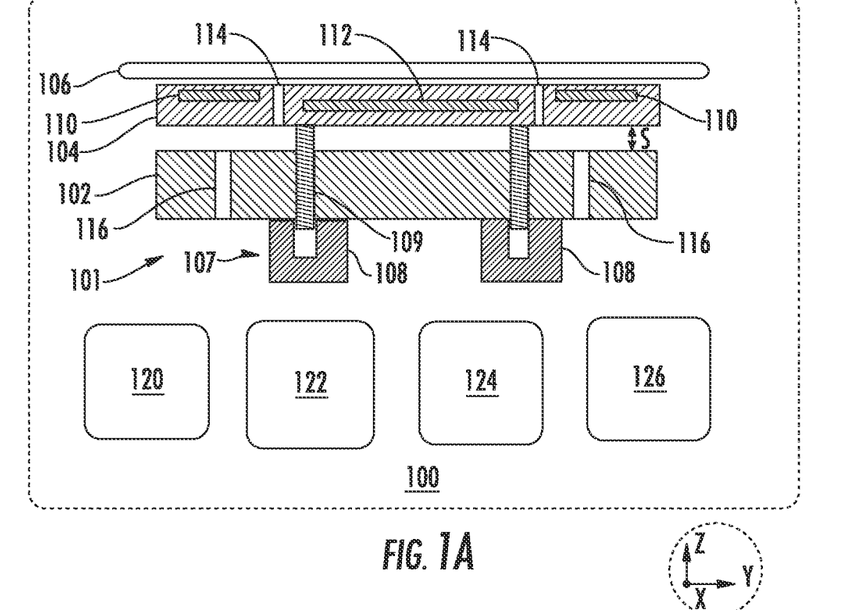
FIG. 1A depicts a side view of an electrostatic clamp system in one operating position according to embodiments of the disclosure.

FIG. 1A depicts a system 100 according to embodiments of the disclosure. The system 100 may be suitable for use in various processing tools in which it may be desirable to provide active heating or cooling to a substrate. Such processing tools include ion implantation systems, deposition systems, etching systems, and annealing systems. The embodiments are not limited in this context however.

The system 100 includes an electrostatic clamp 101, gas supply system 120, voltage supply 122, heater supply 124, and displacement control system 126. The electrostatic clamp 101 includes a base 102 and clamp portion 104 adjacent the base 102. The clamp portion 104 is configured to support a substrate 106, as illustrated. In various embodiments the clamp portion 104 may be a ceramic plate or may contain multiple ceramic layers as is known in the art. The voltage supply 122 is configured to supply a voltage to an electrode system, which may include a plurality of electrodes 110 that are configured to generate an electric field in response to voltage supplied by the voltage supply 122. This generates a clamping force to attract and hold a substrate 106.

The gas supply system 120 is configured to supply a gas (not shown) to the base 102 of electrostatic clamp 101, which may be distributed to the substrate 106 through channels 116 in the base 102 and channels 114 in the clamp portion 104 in order to provide a heat-conducting medium between the electrostatic clamp 101 and substrate 106. In different embodiments, the gas that is supplied to the electrostatic clamp may be helium, neon, argon, nitrogen or other gas species or combination of gas species. The embodiments are not limited in this context. As detailed below, in some circumstances the gas supply system 120 may be further configured to deliver gas between the base 102 and clamp portion 104.

Consistent with various embodiments, the system 100 may be configured in different ways to operate at different substrate temperatures or over different substrate temperature ranges. In order to operate at room temperature or below, such as 25° C. to −100° C., coolant such as water or other coolant fluid, liquid or gaseous, (not separately shown) may be delivered to the base 102. For elevated temperature operation, the heater supply 124 may drive a heater 112, which may be embedded within the clamp portion 104 as shown or may alternatively be a surface mounted heater. This may be used to heat the clamp portion 104 and a substrate 106 to a desired temperature such as 100° C. to 500° C. or above.

In order to tailor the operation of the electrostatic clamp 101 for different substrate ranges, the displacement control system 126 may send a signal to a displacement assembly 107 to move the clamp portion 104 and base 102 with respect to one another from a first operating position to a second operating position. The first operating position may correspond to a position in which the clamp portion 104 and base 102 are tightly held together to increase thermal conduction between the clamp portion 104 and base 102. This operating position may be used when the electrostatic clamp 101 is to be cooled to maintain the electrostatic clamp 101 at room temperature or below. In addition, in some embodiments, to increase thermal conduction between the clamp portion 104 and base 102, a gas flow may be provided by gas supply system 120 between the base 102 and clamp portion 104. In this manner, when coolant that is supplied to the base 102, the base 102 may act as an effective heat sink for the clamp portion 104 to cool the clamp portion 104 and a substrate 106 that is held by the clamp portion 104.

The second operating position may correspond to a position in which the clamp portion 104 and base 102 are physically separated such that a gap exists between the clamp portion 104 and base 102. The second operating position may be used, for example, when the clamp portion 104 is to be heated by the heater supply 124 to an elevated temperature. When a gap exists between the clamp portion 104 and base 102 thermal conduction between the clamp portion 104 and base 102 is reduced from a first thermal conduction when the clamp portion 104 and base 102 are in the first operating position to a second thermal conduction that is less than the first thermal conduction when the clamp portion 104 and base 102 are in the second operating position. This allows the clamp portion 104 to be heated to an elevated temperature without causing the base 102 to heated to the same elevated temperature. For example, in some embodiments, in the second operating position the clamp portion 104 may be heated to 500° C. or higher while the base 102 is maintained below 100° C. Thus, whether the electrostatic clamp 101 is operated at room temperature or below, or at elevated temperature, the base 102 may be maintained at a relatively low temperature such as below 100° C. Moreover, because the base 102 and clamp portion 104 may be physically separated from one another when the electrostatic clamp 101 is to be operated at high temperature, thermal mismatch stress between the base 102 and clamp portion 104 may be avoided as the clamp portion 104 heats up to elevated temperatures or cools down from elevated temperatures, which stresses may otherwise occur if the base 102 and clamp portion 104 were bonded to one another or otherwise affixed to one another.

In various embodiments, the displacement assembly 107 may comprise at least one displacement component, shown as displacement component 108, that is configured to move the base 102 with respect to the clamp portion 104 in the direction parallel to the Z-axis of the Cartesian coordinate system illustrated. Various different embodiments of a displacement component 108 are detailed with respect to the figures to follow. However, possible examples of displacement components include piezoelectric devices that expand or contract based upon an applied voltage, a spring bellows actuator, a solenoid-driven piston actuator, or a mechanical cam. The embodiments are not limited in this context.

In FIG. 1A, the electrostatic clamp 101 is depicted in an operating position for high temperature operation in which the clamp portion 104 and base 102 are physically separated from one another. In this position, the electrostatic clamp 101, if employed in an apparatus such as an ion implanter, may operate in a vacuum environment at a pressure below 10-3 Torr. In other circumstances a vacuum may be applied to the electrostatic clamp 101 by a conventional vacuum apparatus. When a gas pressure between the clamp portion 104 and base 102 is below 10-3 Torr, for example, the thermal transfer between the clamp portion 104 and base 102 is reduced to radiative heat transfer. It is to be noted that under vacuum conditions below 10-3 Torr in order to provide adequate thermal isolation between base 102 and clamp portion 104, the separation S between the base 102 and clamp portion 104 need not be a large distance, and may be, for example, between 3 mm to 3 m in different embodiments. Accordingly, when the clamp portion 104 is heated to 500° C., for example, little thermal conduction may take place between base 102 and clamp portion 104 in the example of FIG. 1A.

Figure 1B:
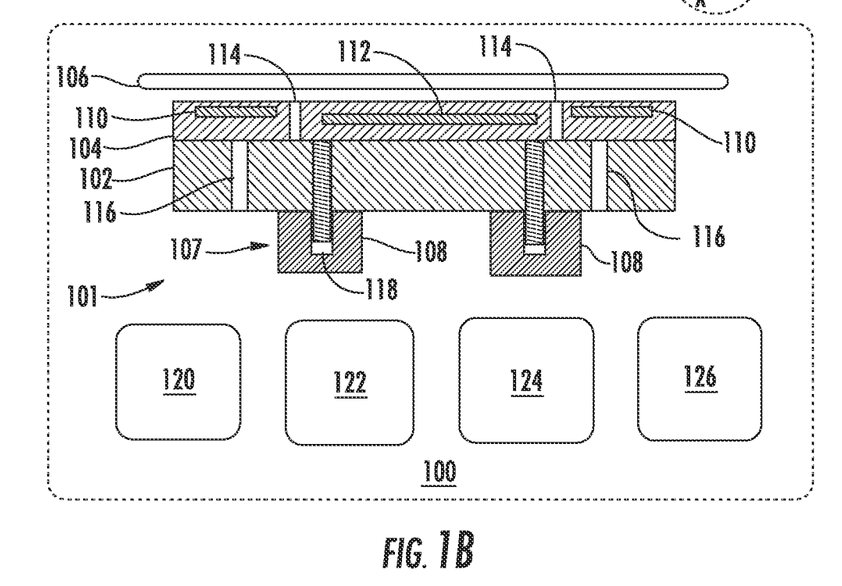
FIG. 1B depicts a side view the electrostatic clamp system of FIG. 1A in another operating position.
Figure 1C:
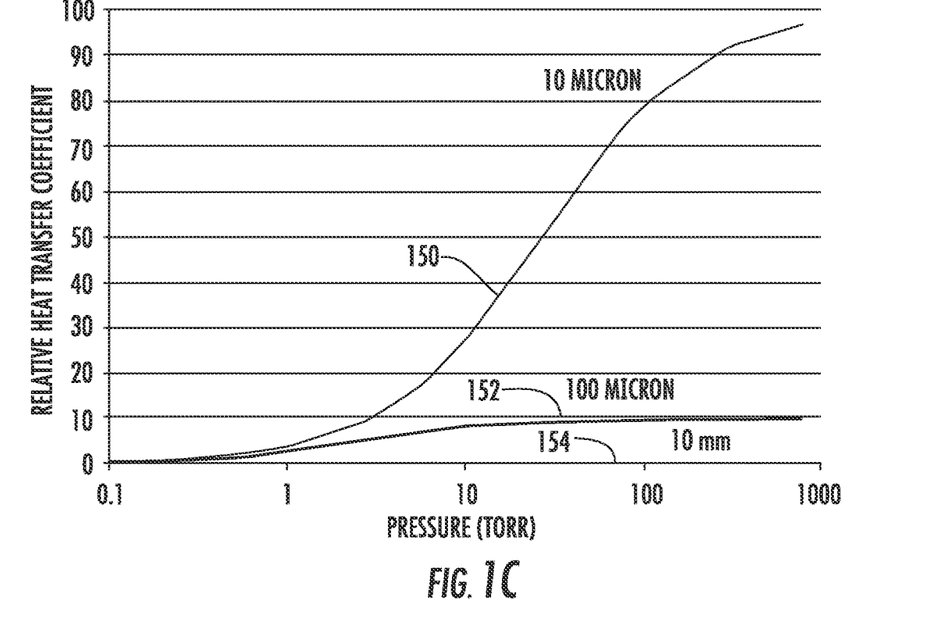
FIG. 1C provides calculated heat transfer coefficients as a function of gas pressure for three different separations of two adjacent bodies.

In FIG. 1B, the electrostatic clamp 101 is depicted in an operating position for room temperature or lower operation in which the clamp portion 104 and base 102 are physically held together. In this position, a gas flow may be supplied as noted above to the electrostatic clamp 101 by flowing gas through the channels 116, to generate a gas pressure between the clamp portion 104 and base 102 that is at least 1 Torr, for example, 1-50 Torr, in order to provide adequate thermal conduction between the clamp portion 104 and base 102. At this gas pressure, heat transfer efficiency or coefficient between the clamp portion 104 and base 102 may approach a value of unity. FIG. 1C is a graph that provides calculated heat transfer coefficients as a function of gas pressure for three different separations of two adjacent bodies, which may be represented by the clamp portion 104 and base 102. The curve 150 illustrates heat transfer for a separation of 10 micrometers, the curve 152 illustrates heat transfer for a separation of 100 micrometers and the curve 154 illustrates heat transfer for a separation of 10 millimeters. In the latter case, heat transfer is poor up to atmospheric pressure (760 Torr) remaining below 1%. At 100 micrometers separation heat transfer coefficient reaches an asymptotic value of 10% above 100 Torr, while at 10 micrometers, heat transfer coefficient increases substantially above 10 Torr and exceeds 50% above 30 Torr. Accordingly, a desired heat transfer, such as a value exceeding 50% between a base 102 and clamp portion 104 may be accomplished by holding the base 102 and clamp together such that the average separation is less than 10 micrometers, and the gas pressure exceeds 30 Torr. However, other combinations of separation and gas pressure are possible to achieve the same level of heat transfer as may be appreciated by those of skill in the art.

In order to minimize gas leakage into a processing system (not shown) that includes the electrostatic clamp 101, the gas pressure may be maintained below 50 Torr in some implementations. In this scenario both base 102 and clamp portion 104 may be effectively cooled by coolant that may flow through the base 102.

As shown in particular in FIGS. 1A and 1B, in various embodiments a movable portion 109 of a displacement component 108 may extend through the base 102 and contact the clamp portion 104. In some embodiments the displacement component 108 is bonded to the clamp portion 104 such that a relative motion of a movable portion 109 results in a change in the relative position of base 102 with respect to clamp portion 104.

Figure 1D:
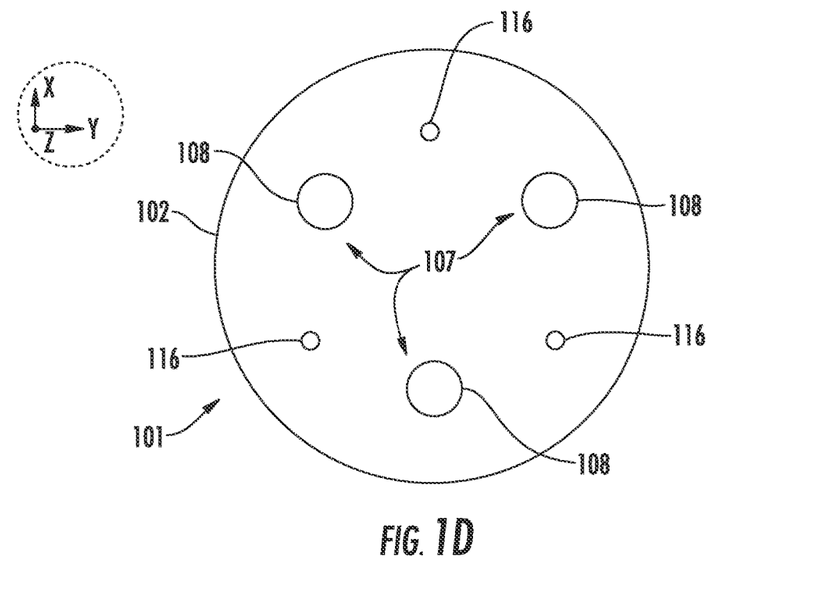
FIG. 1D depicts a bottom plan view of the electrostatic clamp system of FIG. 1A.

As noted above a displacement assembly 107 may include at least one displacement component 108 to vary the relative position of base 102 and clamp portion 104. In various embodiments the displacement assembly 107 may include multiple displacement components that are arranged at different locations over the surface of a base 102. FIG. 1D depicts a bottom plan view of an embodiment of the electrostatic clamp 101 in which three different displacement components, shown as displacement component 108, are mutually arranged as shown. However, in other embodiments fewer or a larger number of displacement components 108 may be used to form a displacement assembly.

In further embodiments, an electrostatic clamp may include a foil, sheet, or plate that is disposed between a base and clamp portion and is used to manage heat flow between the base and clamp portion. Such a component is referred to herein as a "heat control layer" and may be composed of a metal material in various embodiments. In various embodiments, a heat control layer may provide good thermal conductivity when an electrostatic clamp is operating in a cooling mode in a first operating position, may provide heat spreading ability to improve thermal conductivity across layers, and may provide very low emissivity so as to reduce radiative heat loss when the electrostatic clamp is operating in a hot mode in a second operating position.

Figure 2A:
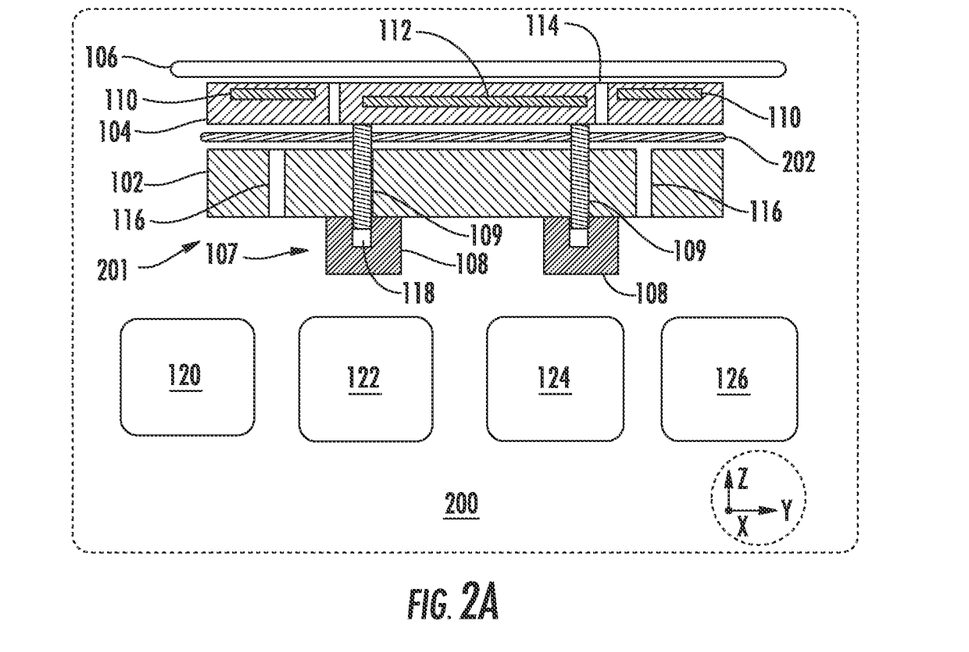
FIG. 2A depicts a side view of another electrostatic clamp system in one operating position according to further embodiments of the disclosure.

FIG. 2A depicts a system 200 that may be configured with similar components as described above with respect to system 100. In addition, the electrostatic clamp 201 of system 200 includes a heat control layer 202 that is disposed between the base 102 and clamp portion 104. In the instance depicted in FIG. 2A, the base 102 and clamp portion 104 are in an operating position for high temperature use in which the clamp portion 104 is separated from the base 102. In addition, the heat control layer 202 is separated from both the base 102 and clamp portion 104. As detailed below, a heat control layer 202 may function to better couple heat flow between the base 102 and clamp portion 104 when these components are held together, and may function to prevent heat flow from the clamp portion 104 to base 102 when the base and clamp portion 104 are held apart by acting as a radiation heat transfer shield.

Figure 2B:
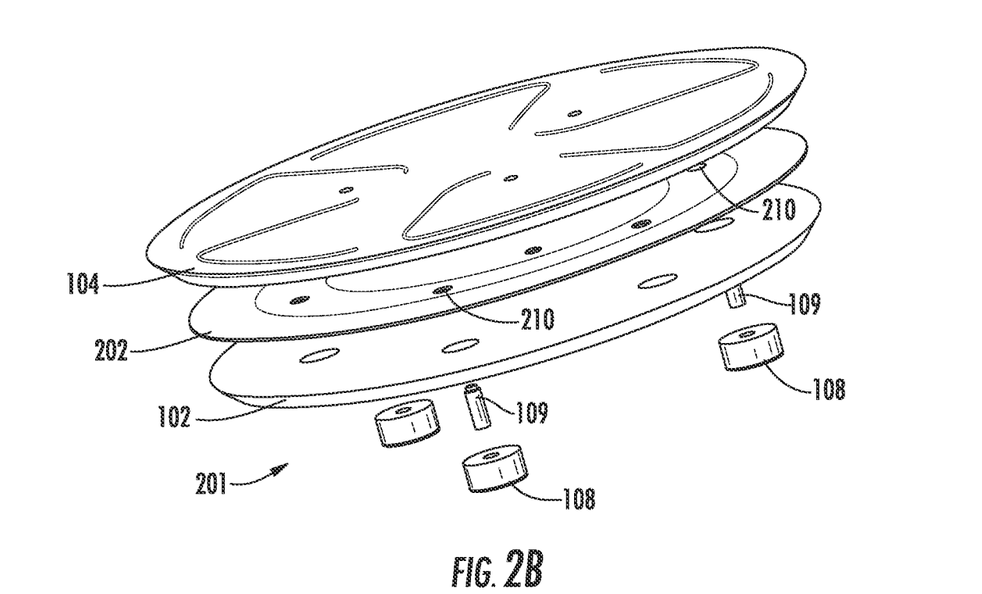
FIG. 2B depicts an exploded perspective view the electrostatic clamp system of FIG. 2A.

In various embodiments disclosed with respect to the figures to follow, a displacement component may control the relative position of a base, a clamp portion, and a heat control layer. In some instances a first portion of the displacement component is affixed to the base and a second portion of the displacement component is affixed to the clamp portion. In order to move from a first operating position to a second operating the first portion of the displacement component may be movable with respect to the second portion. FIG. 2B depicts an exploded perspective view of the electrostatic clamp 101 illustrating one variant of the aforementioned base 102 and clamp portion 104. The heat control layer 202 may be a metal foil or plate having holes or apertures 210 that accommodate the movable portions 109 of the displacement component 108 to allow the movable portions 204 to couple to the clamp portion 104.

As noted above, when a displacement control system such as displacement control system 126 generates a signal, the movable portion 109 of a displacement component 108 may undergo a relative motion with respect to base 102 and may thus generate a relative motion of the base 102 with respect to the clamp portion 104. In some embodiments, in addition to generating a relative displacement of a clamp portion and base, a displacement component may be configured to automatically generate a second relative motion of a heat control layer with respect to base and clamp portion so as to create a first gap between the base and heat control layer and a second gap between the clamp portion and heat control layer.

Figure 3A:
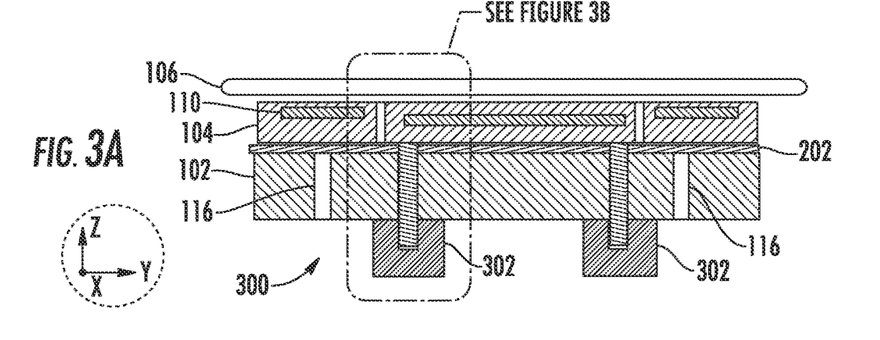
FIG. 3A depicts a side view of an electrostatic clamp according to additional embodiments of the disclosure.
Figure 3B:
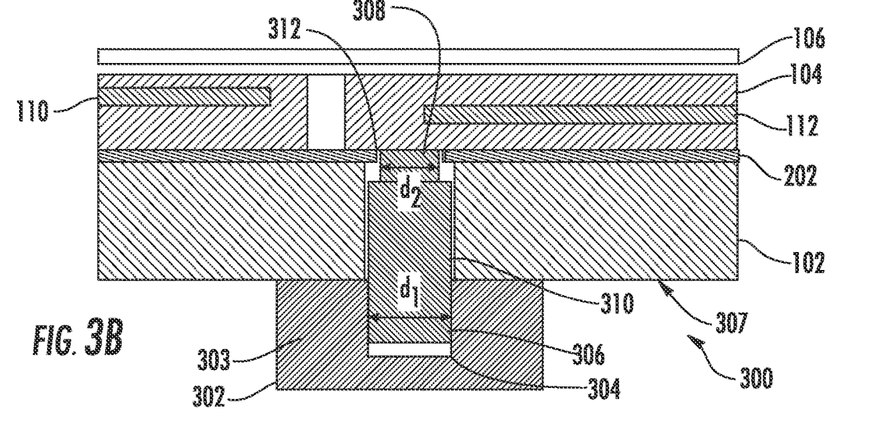
FIG. 3B depicts a close-up view of the electrostatic clamp of FIG. 3A in one operating position.
Figure 3C:
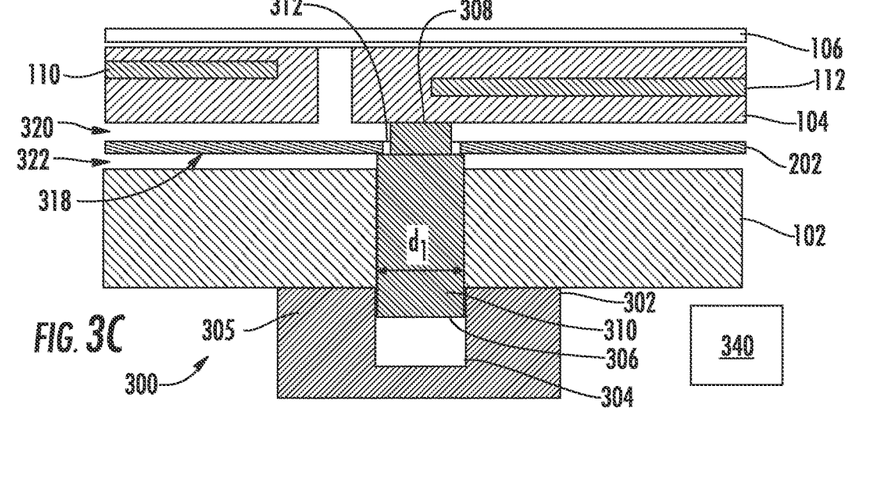
FIG. 3C depicts a close-up view of the electrostatic clamp of FIG. 3A in another operating position.

FIG. 3A depicts an embodiment of an electrostatic clamp 300 in which displacement components 302 are provided to control the relative position of the base 102 with respect to the clamp portion 104 and to control the relative position of the heat control layer 202 with respect to the clamp portion 104 and base 102. Details of operation of a displacement component 302 are illustrated in FIGS. 3B and 3C. In particular, FIGS. 3B and 3C illustrate a close-up showing a portion of the electrostatic clamp 300 in the first operating position and second operating position, respectively. In the first operating position shown in FIG. 3B the base 102, clamp portion 104 and heat control layer 202 are held together so as to provide good thermal conduction between the base 102 and clamp portion 104, which is suitable for operation of the electrostatic clamp 300 at room temperature or below. In addition, gas flow may be provided, for example, through channels 116, to generate a gas pressure of 1 Torr to 20 Torr between the base 102 and clamp portion 104 in some cases. This gas flow may provide further enhancement to thermal conduction between the base 102 and clamp portion 104 so that the clamp portion 104 can be maintained at a temperature similar to or the same as that of the base 102. The heat control layer 202 may further act as a heat spreader that generates a rapid heat conduction with the X-Y plane, that is, within the plane of the heat control layer 202. This may aid in generating uniform heating across the interface between the base 102 and clamp portion 104.

As further shown in FIG. 3B, the displacement component contains a head portion 305 and a rod 306 that acts as a movable portion so as to adjust the relative position of the clamp portion 104 and base 102. In one implementation, the head portion 305 may be affixed to the base 102 at the lower surface 307, while the rod 306 may be affixed to the clamp portion 104. In different embodiments, the rod 306 may be affixed to the clamp portion 104 via brazing, flexures, threads or other suitable approaches.

The rod 306 may be disposed in a cavity 304 that facilitates slidable movement of the rod 306 with respect to the head portion 305, and therefore also with respect to the base 102. The rod 306 may include a main portion 310 having a diameter d1 and a recessed portion 308 having a diameter d2. As illustrated, the recessed portion 308 may be affixed to the clamp portion 104. The diameter d2 of the recessed portion 308 is arranged to be less than the diameter (not separately shown) of an aperture 312 of the heat control layer 202. This facilitates slidable movement of the rod 306 with respect to the heat control layer 202.

Figure 3D:
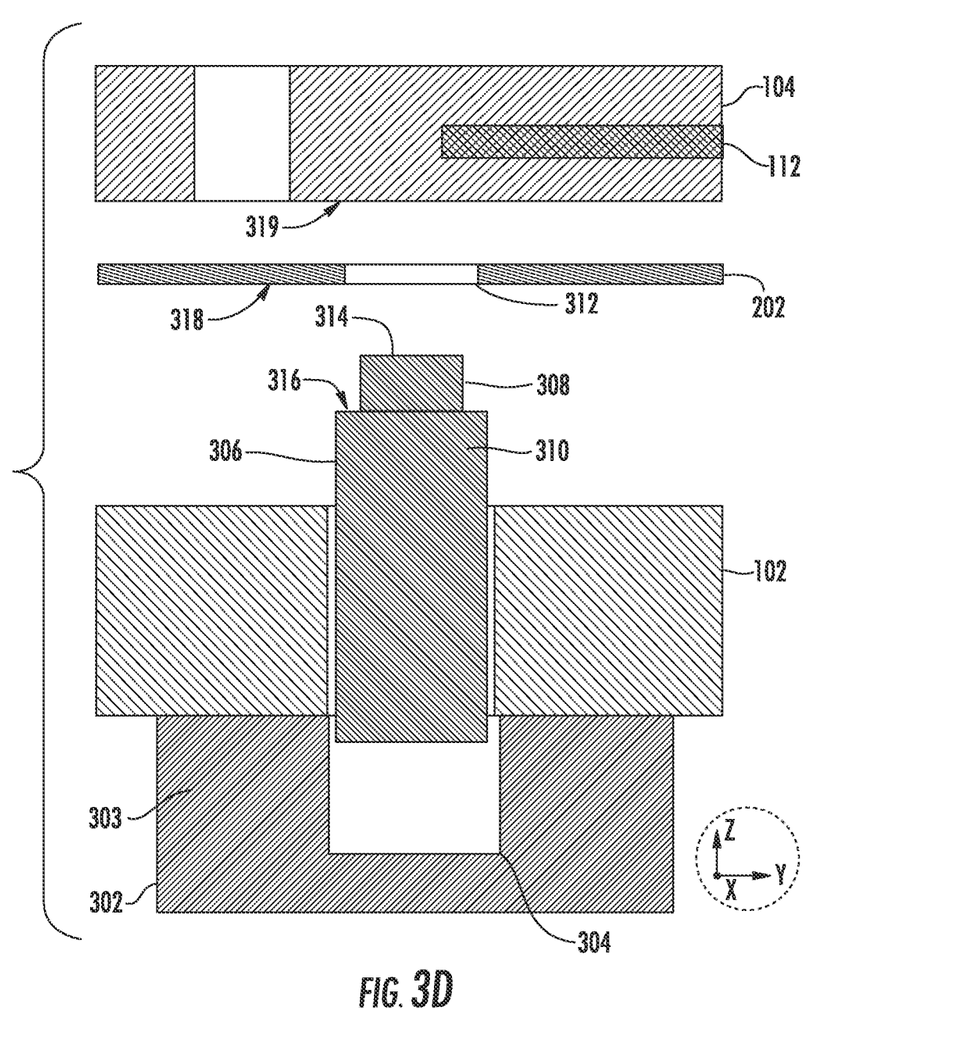
FIG. 3D depicts an exploded close-up view of the electrostatic clamp of FIG. 3A.

FIG. 3D is an exploded view illustrating in more detail the engagement of the rod 306 with the heat control layer 202 and clamp portion 104. As illustrated, the recessed portion 308 has an upper region 314. Although shown apart, in various embodiments the upper region 314 is bonded or otherwise affixed to the lower surface 319 of the clamp portion 104. The main portion 310 of the rod 306 has an upper surface 316 that not bonded to other surfaces, but is configured to engage the lower surface 318 of the heat control layer 202 as explained below with respect to FIG. 3C.

FIG. 3C illustrates a close-up showing a portion of the electrostatic clamp 300 in a second operating position. In this operating position the base 102, clamp portion 104 and heat control layer are held apart so as to reduce thermal conduction between the base 102 and clamp portion 104, which is suitable for operation of the electrostatic clamp 300 at elevated temperature. In addition, vacuum may be applied via a vacuum environment that is provided in a chamber of a processing apparatus in which the electrostatic clamp 300 operates, or via a vacuum system 340 to generate a low pressure below 10-3 Torr between the base 102 and clamp portion 104. This vacuum may further reduce thermal conduction between base 102 and clamp portion 104. In addition, as shown in FIG. 3C, the rod 306 is displaced upwardly with respect to head portion 305 as compared to its position in the example of FIG. 3B. This displacement of the rod 306 causes the clamp portion 104 to be separated from the base 102. Moreover, in this embodiment, the diameter d1 of main portion 310 of the rod 306 is arranged to be larger than the diameter of the aperture 312 so that the main portion engages the heat control layer 202 when the rod 306 is displaced upwardly a sufficient amount. In this manner, the heat control layer 202 may be held above the base 102 by the rod 306 so as to generate a gap 322 between the base 102 and heat control layer 202. In embodiments in which the direction of gravitational force faces downwardly as shown in FIG. 3C, the heat control layer 202 may also rest on the top of the main portion 310 of the rod 306 as shown, thus defining a gap 320 between the heat control layer 202 and clamp portion 104. In this manner two separate vacuum gaps may be created between the clamp portion 104 and base 102. In applications where the electrostatic clamp is used in other orientations relative to the gravity field a mechanism may be added to the rod 306 to lock the heat control layer 202 in place.

In various embodiments a heat control layer 202 may be composed of a metallic material having a high reflectivity so as to reflect radiative energy that may be generated from the clamp portion 104, so as to reduce the amount of radiative heat transferred from the clamp portion to the base 102.

In various additional embodiments an electrostatic clamp may include a plurality of heat control layers that are disposed between a clamp portion and base. In a first operating position for cooling mode operation, the base, clamp portion, and all heat control layers may be tightly held together such that an average gap between adjacent components is less than 10 micrometers. In a second operating position the base and clamp portion may be separated as described with respect to the aforementioned embodiments using displacement components, and the heat control layers may additionally be separated from one another so as to define three or more gaps between the base and clamp portion. This may be accomplished in some embodiments using multiple displacement components that are configured according to the mechanism of FIGS. 3B-3D.

Figure 3E:
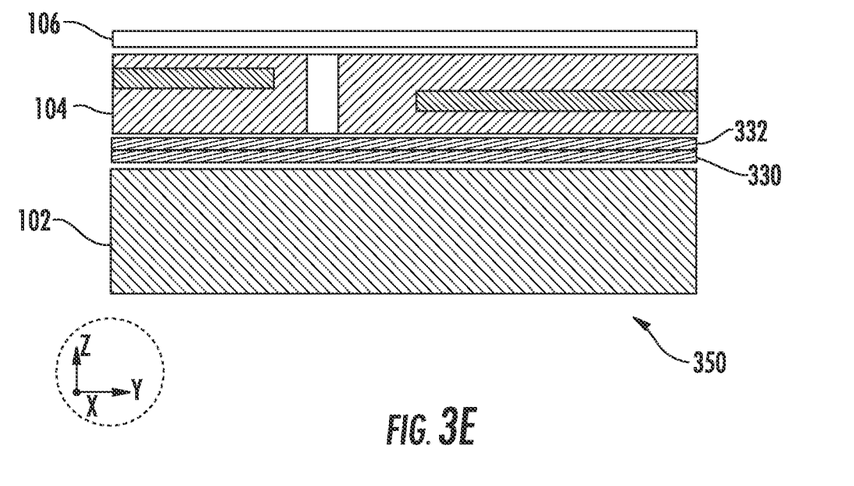
FIG. 3E depicts an embodiment of an electrostatic clamp having multiple heat control layers in a first operating position.

FIG. 3E depicts an embodiment of an electrostatic clamp 350 having multiple heat control layers, shown in a first operating position, in which a first heat control layer 330 and second heat control layer 332 are disposed between a base 102 and clamp portion 104. In the first operating position the electrostatic clamp 350 may be operated at room temperature or below, for example. The base 102, first heat control layer 330, second heat control layer 332, and clamp portion 104 may be held together using displacement components (not shown) arranged according to the principles described above with respect to FIGS. 3A to 3D.

Figure 3F:
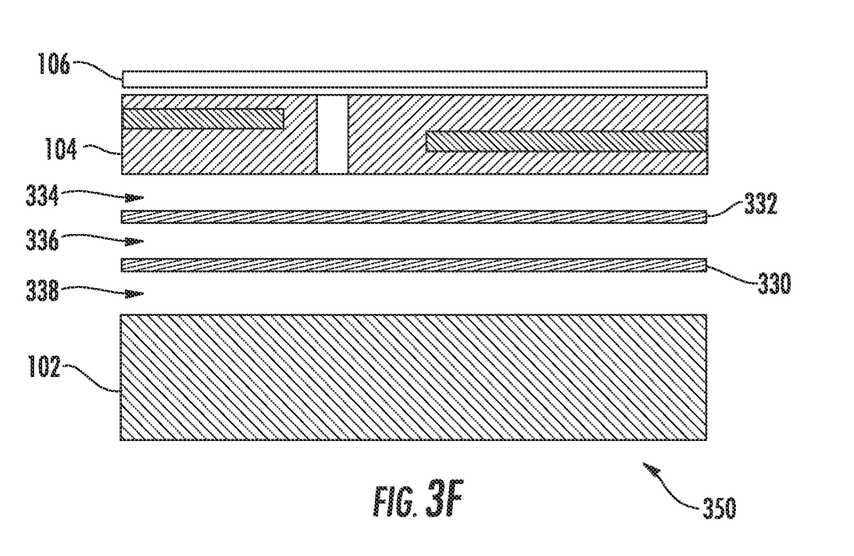
FIG. 3F depicts the electrostatic clamp of FIG. 3E in a second operating position.

FIG. 3F depicts an instance in which the electrostatic clamp 350 is in a second operating position. In this case, in addition to a lower gap 338 formed between the base and first heat control layer 330, a middle gap 336 is formed between the first heat control layer 330 and second heat control layer 332, and a top gap 334 is formed between the second heat control layer 332 and clamp portion 104. To accomplish this, one set of displacement components (not shown) may engage the first heat control layer 330 and another set of displacement components (not shown) may engage the second heat control layer 332 so as to mutually space the first heat control layer 330 and second heat control layer 332 as shown as well as to space the heat control layers from the base 102 and clamp portion 104. However, other spacing mechanisms are possible. In further embodiments three or more heat control layers may be provided between a base and clamp portion.

In various embodiments the actuation or movement of a displacement component may be supplied by the application of voltage or current to the displacement component, or may be supplied by mechanical means.

In some embodiments a displacement component may be configured to hold the base and clamp portion together in an operating position suitable for room temperature operation when power is active to a displacement assembly such that power, voltage or current is applied to the displacement component. In these embodiments, the displacement component may be configured to have a default or fail-safe position when unpowered that places the clamp portion and base apart from one another in an operating position suitable for high temperature operation. In other words, in an absence of power such as a voltage signal or current signal being applied to the displacement component, or in a mechanical failure scenario, the position of the displacement component may be such that the clamp portion is separated from the base. This may be desirable to prevent potentially destructive rapid cooling of a clamp portion and excessive heating of a base portion that might otherwise occur during a power failure when the clamp portion is hot if the default (unpowered) position of the displacement component were such that the clamp portion and base were held together. Under such a default condition, if the clamp portion were composed of a ceramic or multiple ceramic layers, a stress-induced fracture may be induced in the clamp portion due to mismatch in thermal expansion coefficients between the base, which may be a metal, and the clamp portion. In addition, if a hot ceramic clamp portion were suddenly brought into contact with the base during power failure, excessive heat may be conducted into the base and any mounting structures of a clamp, which may not be designed to accommodate such heat.

Figure 4A:
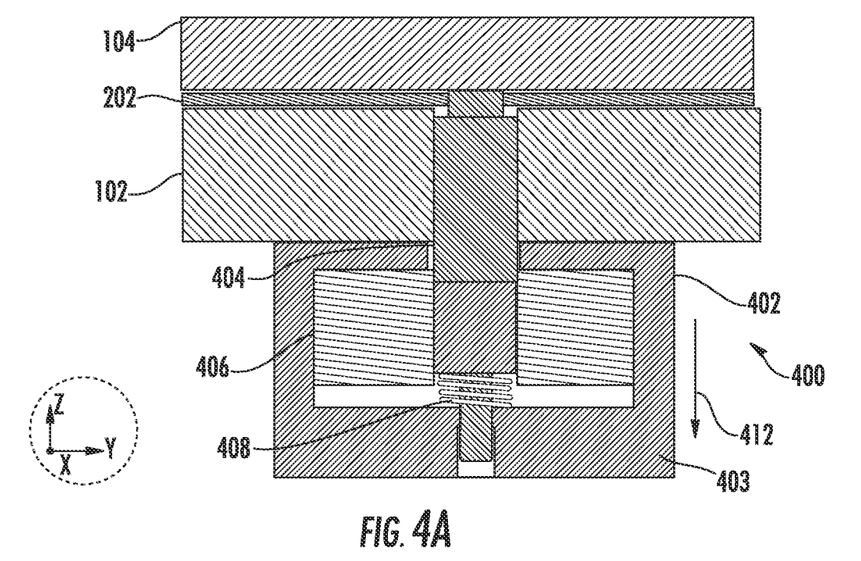
FIG. 4A depicts a close-up view of another embodiment of an electrostatic clamp in one operating position.
Figure 4B:
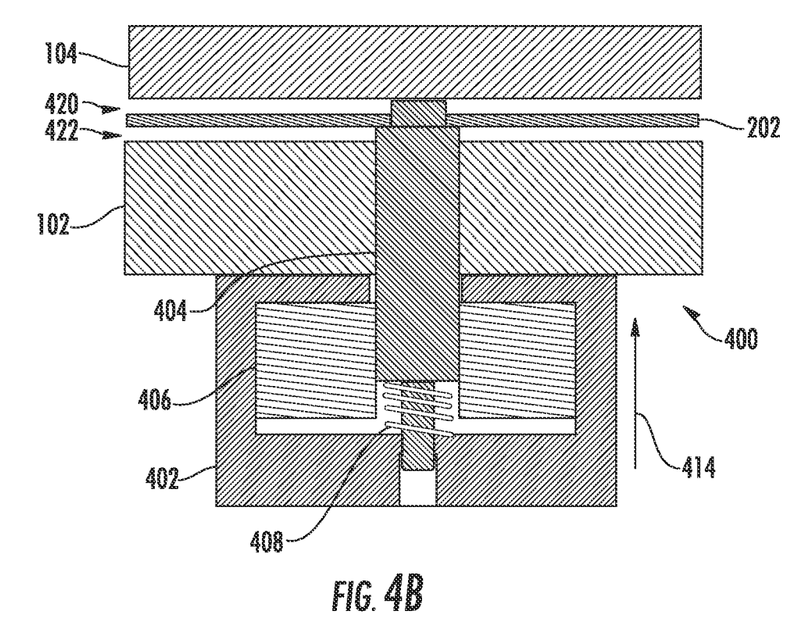
FIG. 4B depicts a close-up view of the electrostatic clamp of FIG. 4A in another operating position.

In different embodiments a displacement component may be configured with a failsafe component to ensure that a clamp portion and base are held apart if no power is present. FIG. 4A and FIG. 4B depict operation of a portion of an electrostatic clamp 400 that includes a displacement component 402 having a failsafe spring mechanism. In this embodiment, the displacement component 402 includes a head portion 403 and rod 404 that is movable with respect to the head portion 403 along directions parallel to the Z-axis. The displacement component 402 also includes a solenoid 406 that generates a force that urges the rod 404 downwardly in the direction 412 when current is supplied to the solenoid 406. This tends to hold the clamp portion 104 and base 102 together in an operating position suitable for room temperature operation or below room temperature operation. As further illustrated in FIG. 4A a failsafe spring 408 is also provided, which is in a compressed state when the clamp portion and base 102 are held together.

Turning now to FIG. 4B there is shown a scenario in which no current is driven through the solenoid 406. This scenario may apply when current is deliberately turned off to the displacement component 402 so that high temperature operation may then ensue. This scenario may also apply when a power failure occurs during operation of the electrostatic clamp 400. As illustrated, because no current is driven through the solenoid 406 no force is generated to urge the rod 406 downwardly. Instead the failsafe spring 408, which is configured to engage the bottom of the rod 406, generates a force that displaces the rod 406 upwardly along the direction 414 so as to separate the base 102, clamp portion 104 and heat control layer 202. If power failure occurs during operation at elevated temperature, no change in displacement may take place since current may not be driven through the solenoid 406 under normal operation at elevated temperature. If power failure occurs during operation at room temperature in which mode the clamp portion 104 and base 102 are initially held together, the clamp portion 104 and base 102 may then be forced apart by failsafe spring 408. However, this scenario may have little deleterious results to the electrostatic clamp itself since both clamp portion 104 and base 102 may be initially at room temperature and may undergo little temperature change after separation.

Figure 5A:
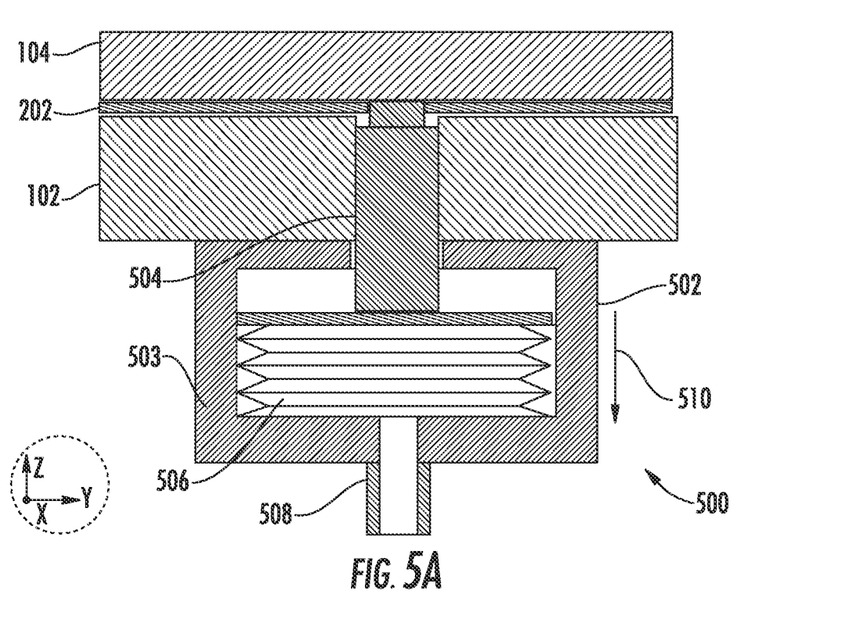
FIG. 5A depicts a close-up view of still another embodiment of an electrostatic clamp in one operating position.
Figure 5B:
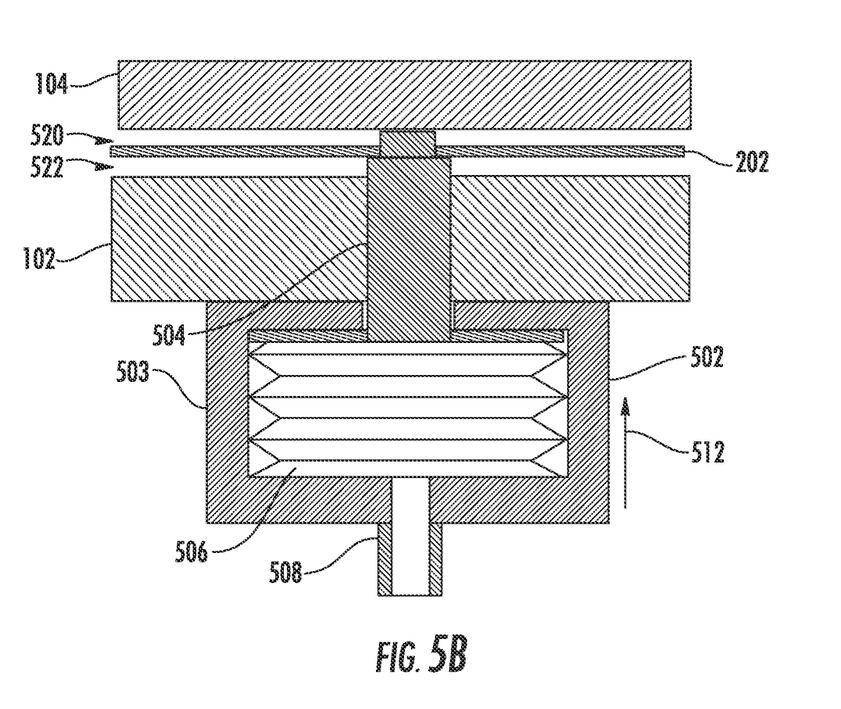
FIG. 5B depicts a close-up view of the electrostatic clamp of FIG. 5A in another operating position.

FIG. 5A and FIG. 5B depict operation of a portion of an electrostatic clamp 500 that includes a displacement component 502 having a failsafe bellows mechanism. In this embodiment, the displacement component 502 includes a head portion 503 and rod 504 that is movable with respect to the head portion 403 along directions parallel to the Z-axis. The displacement component 502 also includes a spring bellows 506 that that urges the rod 504 downwardly in the direction 510 when power is supplied to a vacuum (not shown) that is coupled to the spring bellows 506 via vacuum line 508. When a vacuum is drawn in spring bellows 506 retraction occurs and the spring bellows 506 tends to collapse so as to reduce volume. This tends to hold the clamp portion 104 and base 102 together in an operating position suitable for room temperature operation or below room temperature operation.

Turning now to FIG. 5B there is shown a scenario in which no power is supplied to a vacuum thus allowing the spring bellows 506 to relax to its natural, expanded, state. This scenario may also apply when a power failure occurs during operation of the electrostatic clamp 500 or during deliberate operation at elevated temperature. As in the example of electrostatic clamp 400, the default result under power failure is to displace the rod 506 upwardly along the direction 512 so as to separate the base 102, clamp portion 104 and heat control layer 202

Figure 6:
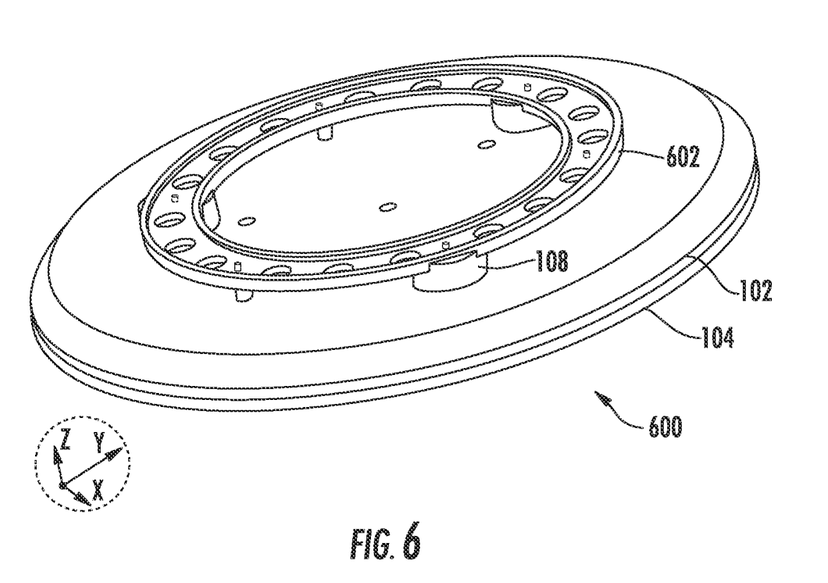
FIG. 6 depicts a bottom perspective view of an electrostatic clamp according to another embodiment.
Figure 7:
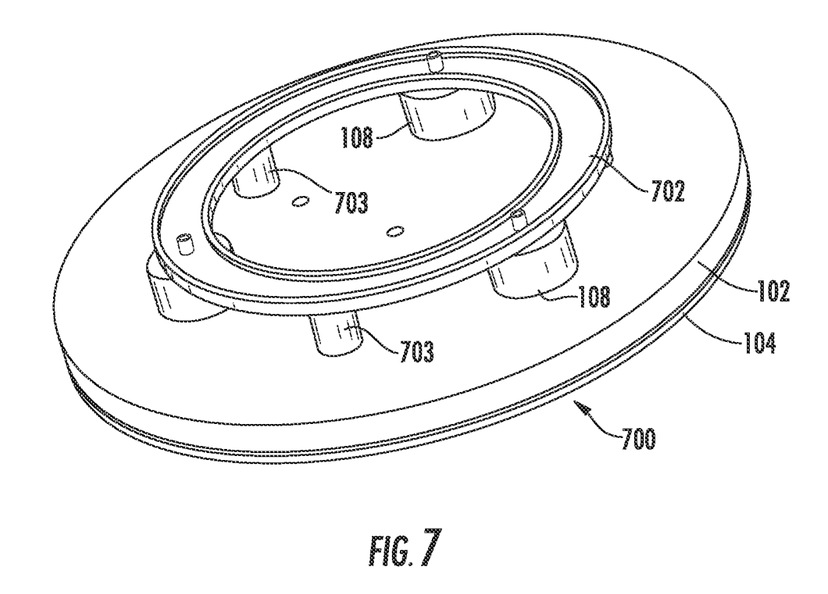
FIG. 7 depicts a bottom perspective view of an electrostatic clamp according to yet another embodiment.

As noted this setting of default condition to hold a clamp portion and base apart from one another may help avoid unwanted rapid heat transfer from a hot clamp portion and other, cold components of an electrostatic clamp that might otherwise occur. FIGS. 6 and 7 illustrate a bottom perspective view of further embodiments of electrostatic clamps, which illustrate exemplary support structures. FIG. 6 shows a perforated support structure 602 (flexure) which is attached to the displacement component 108 and moves as the displacement component 108 is actuated. The rod 306 may be attached to the support structure 602 and may move the clamp portion 104 as described above with respect to FIGS. 1 through 4. The support structure 602 thermally isolates the rod 306 from the displacement component 108 to decrease heat flow from the clamp portion 104 to the base 102. FIG. 7 shows another support structure 702, which creates thermal isolation of the base 102 and the clamp portion 104. In this embodiment the support structure 702 is mounted to the base 102 by at least one standoff 703. The displacement component 108 is attached to the support structure 702 and rod 306 is driven by the displacement component 108 so as to move the clamp portion 104. This embodiment increases the thermal isolation between the base 102 and the clamp portion 104 as in FIG. 6. Support structure 602 and support structure 702 are designed to optimize thermal isolation between the base 102 and the clamp portion 104 while providing sufficient structural strength to operate the electrostatic clamp in all operating conditions.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. An apparatus to hold a substrate, comprising:
   a base;
   a clamp portion configured to apply a clamping voltage to the substrate; and
   a displacement assembly configured to hold the clamp portion and base together in a first operating position, and to move the clamp portion with respect to the base from the first operating position to a second operating position,
   wherein the clamp portion and base are separate from one another in the second operating position.

2. The apparatus of claim 1, wherein the clamp portion comprises a ceramic having an electrode system to apply the clamping voltage.

3. The apparatus of claim 1, further comprising a gas supply system operative to deliver gas flow between the base and clamp portion when the clamp portion and base are in the first operating position, wherein a first thermal conduction between the base and the clamp portion that results from the first operating position is greater than a second thermal conduction between the base and clamp portion that results from the second operating position.

4. The apparatus of claim 1, further comprising a heater configured to deliver heat to the clamp portion when the base and clamp portion are in the second operating position.

5. The apparatus of claim 3, wherein the gas supply system is further configured to deliver gas between the clamp portion and substrate.

6. The apparatus of claim 4, further comprising at least one heat control layer, disposed between the clamp portion and base wherein the at least one heat control layer is configured to reflect heat received from the clamp portion when the clamp portion and base are disposed in the second operating position.

7. The apparatus of claim 1 wherein the displacement assembly comprises at least one displacement component, the at least one displacement component having a head affixed to the base and a rod that is movable with respect to the head and configured to mutually displace the clamp and base from the first operating position to the second operating position.

8. The apparatus of claim 7, further comprising a heat control layer disposed between the clamp and base, wherein the rod comprises:
   a recessed portion having an upper region affixed to a lower surface of the clamp portion that faces the base; and
   and a main portion having an upper surface that is configured to engage the heat control layer, wherein in the second operating position the rod is configured to hold the heat control layer between the base and clamp portion, wherein a first gap is established between the base and heat control layer and a second gap is established between the clamp and heat control layer.

9. The apparatus of claim 7, the at least one displacement component further comprising a failsafe spring configured to engage the rod and generate a force that urges the rod from the head, wherein the base and clamp portion are placed in the second operating position when power is disrupted to the at least one displacement component.

10. The apparatus of claim 9, wherein the at least one displacement component comprises a solenoid configured when activated to generate a force that pulls the rod against the failsafe spring so as to place the base and clamp in the first operating position.

11. The apparatus of claim 9, wherein the at least one displacement component comprises a spring bellows configured to expand so as to place the base and clamp in the second operating position when no vacuum is applied to the spring bellows and to contract so as to place the base and the clamp in the first operating position when a vacuum is applied to the spring bellows.

12. An electrostatic clamp system, comprising
   a base;
   a clamp portion comprising a plurality of electrodes configured to apply a clamping voltage to a substrate;
   a heat control layer disposed between the base and clamp portion; and
   a displacement assembly coupled to the clamp portion, configured to hold the base and clamp portion together in a first operating position, and configured to move the clamp portion with respect to the base from a first operating position to a second operating position,
   wherein in the second operating position the base, clamp portion, and heat control layer are mutually separated from one another.

13. The electrostatic clamp system of claim 12, further comprising:
   a displacement control system configured to send a signal to the displacement assembly to move between the first operating position and second operating position;
   a gas supply system operative to deliver gas flow between the base and clamp portion when the clamp portion and base are in the first operating position;
   a heater configured to deliver heat to the clamp portion when the base and clamp portion are in the second operating position; and
   a vacuum system operative to generate a vacuum of less than $10^{-3}$ Torr when the base and clamp portion are in the second operating position.

14. The electrostatic clamp system of claim 12 wherein the displacement assembly comprises a plurality of displacement components, wherein a displacement component of the plurality of displacement components comprises a head affixed to the base and a rod that is movable with respect to the head and configured to mutually displace the clamp and base from the first operating position to the second operating position.

15. The electrostatic clamp system of claim 14, wherein the rod comprises:
   a recessed portion having an upper region affixed to a lower surface of the clamp portion that faces the base; and
   a main portion having an upper surface that is configured to engage the heat control layer, wherein in the second operating position the rod is configured to hold the heat control layer between the base and clamp portion in a manner that defines a first gap between the heat control layer and base and a second gap between the heat control layer and clamp portion.

16. The electrostatic clamp system of claim 14, the at least one displacement component further comprising a failsafe component configured to engage the rod and generate a force that urges the rod from the head, wherein the base and clamp portion are placed in the second operating position when power is disrupted to the at least one displacement component.

17. The electrostatic clamp system of claim 12, wherein the heat control layer is a first heat control layer, the electrostatic clamp system further comprising a second heat control layer disposed between the first heat control layer and the clamp portion,
   wherein in the second operating position the base, clamp portion, the first heat control layer, and second heat control layer are mutually separated from one another so as to define a lower gap between the first heat control layer and base, a middle gap between the first heat control layer and the second heat control layer, and a top gap between the second heat control layer and the clamp portion.

18. A method to hold a substrate, comprising:
   holding a base and a clamp portion together in a first operating position when the clamp portion is unheated;
   moving the base and clamp portion from the first operating position using a displacement component that is affixed to the clamp portion in a first region of the displacement component and affixed to the base in a second region of the displacement component; and
   heating the clamp portion when the base and clamp portion are in a second operating position,
   wherein a first thermal conduction between the base and the clamp portion that results from the first operating position is greater than a second thermal conduction between the base and clamp portion that results from the second operating position.

19. The method of claim 18, further comprising
   delivering gas flow between the base and clamp portion when the clamp portion and base are in the first operating position to generate a gas pressure of 1-50 Torr; and
   evacuating a region between the base and clamp portion to a vacuum of less than $10^{-3}$ Torr when the base and clamp portion are in the second operating position.

20. The method of claim 18, further comprising providing a heat control layer between the base and clamp portion, and engaging the heat control layer on the displacement component in the second operating position, wherein a first gap is established between the base and heat control layer and a second gap is established between the clamp portion and heat control layer.

* * * * *